United States Patent [19]
Stein et al.

[11] Patent Number: 5,335,134
[45] Date of Patent: Aug. 2, 1994

[54] CIRCUIT CONFIGURATION FOR PROTECTING TERMINALS OF INTEGRATED CIRCUITS

[75] Inventors: Christian Stein, München; Xaver Guggenmos, Dachau; Joachim Krause, Landshut, all of Fed. Rep. of Germany

[73] Assignee: Siemens Aktiengesellschaft, Munich, Fed. Rep. of Germany

[21] Appl. No.: 939,676

[22] Filed: Sep. 3, 1992

Related U.S. Application Data

[63] Continuation-in-part of Ser. No. 651,312, Feb. 6, 1991, abandoned.

[30] Foreign Application Priority Data

Feb. 6, 1990 [DE] Fed. Rep. of Germany ....... 4003560

[51] Int. Cl.$^5$ .............................................. H02H 3/10
[52] U.S. Cl. ........................................ 361/56; 361/91
[58] Field of Search ..................... 361/54, 56, 91

[56] References Cited

U.S. PATENT DOCUMENTS

| | | | |
|---|---|---|---|
| 4,829,350 | 5/1989 | Miller | 361/91 |
| 4,855,620 | 8/1989 | Duvvury et al. | 361/91 |
| 4,996,626 | 2/1991 | Say | 361/91 |
| 5,144,515 | 9/1992 | Fruhauf et al. | 361/56 |
| 5,208,475 | 5/1993 | Mortensen | 361/91 |

*Primary Examiner*—Thomas M. Dougherty
*Attorney, Agent, or Firm*—Herbert L. Lerner; Laurence A. Greenberg

[57] ABSTRACT

A circuit configuration protects the terminals of integrated circuits, in particular CMOS circuits. The circuit configuration includes bypass transistors connected between the terminals of the integrated circuit and respective supply potential terminals. The bypass transistors are thin-oxide transistors of the n-channel type and are connected such that their gate-to-source voltage is zero.

4 Claims, 1 Drawing Sheet

CIRCUIT CONFIGURATION FOR PROTECTING TERMINALS OF INTEGRATED CIRCUITS

CROSS-REFERENCE TO RELATED APPLICATION

This application is a continuation-in-part of copending application Ser. No. 651,312, filed Feb. 6, 1991.

BACKGROUND OF THE INVENTION

The invention relates to a circuit configuration for protecting terminals of integrated circuits, in particular CMOS circuits, in which bypass transistors are connected between the circuit terminals and supply potential terminals.

In the context of the invention, the term "terminal" includes not only inputs, outputs, and combined inputs/outputs, but also supply potential connections.

Circuit configurations of this generic type are known and are described in more detail below in the description of the drawings.

Experiments on which the invention is based have shown that using MOS transistors of unlike channel types results in dissimilar response behavior in the transistors and therefore in poor protection against electrostatic voltages, or ESD protection.

SUMMARY OF THE INVENTION

It is accordingly an object of the invention to provide a circuit configuration for protecting terminals of integrated circuits, which overcomes the hereinafore-mentioned disadvantages of the heretofore-known devices of this general type and which has improved ESD protection behavior for integrated circuits, in particular CMOS circuits.

With the foregoing and other objects in view there is provided, in accordance with the invention, a circuit configuration for protecting terminals of integrated circuits, in particular CMOS integrated circuits, comprising bypass transistors connected between the circuit terminals and supply potential terminals, the bypass transistors being thin-oxide transistors of the n-channel type and having zero gate-to-source voltage.

In accordance with a concomitant feature of the invention, the circuit configuration includes an output driver operatively associated with the integrated circuit, the output driver including MOS transistors of the same channel type, and an inverter connected upstream of one of the transistors of the output driver.

Other features which are considered as characteristic for the invention are set forth in the appended claims.

Although the invention is illustrated and described herein as embodied in a circuit configuration for protecting terminals of integrated circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 1:
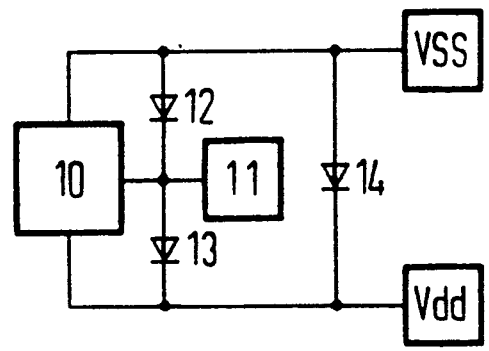
FIG. 1-3 are schematic and block circuit diagrams of three known structures of a protective circuit configuration.
Figure 2:
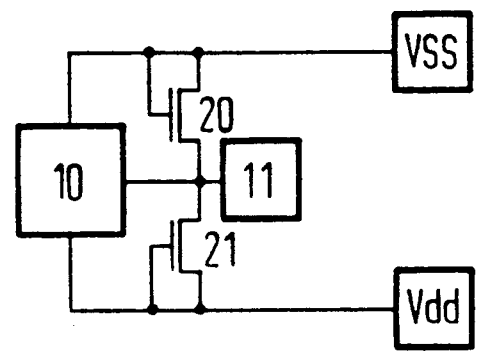
Figure 3:
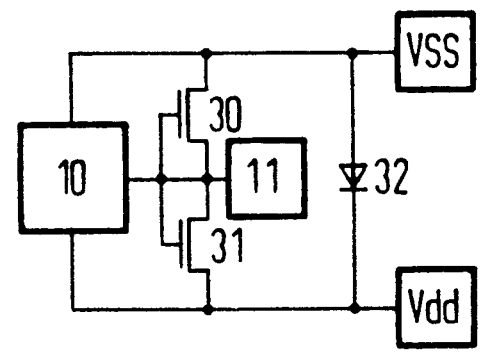

Referring now to the figures of the drawing in detail and first, particularly, to FIGS. 1-3 thereof, there is seen the fundamental structure of known circuit configurations of this generic type. Each of FIGS. 1-3 schematically shows an integrated circuit 10 (a CMOS circuit), with supply potential terminals that are conventionally identified as $V_{ss}$ and $V_{dd}$. schematically illustrated output of the integrated circuit 10 is shown at reference numeral 11.

In order to protect against electrostatic voltages (that is electrostatic discharge) at the output 11, FIGS. 1-3 each have shunt paths, which are provided in FIG. 1 by diodes 12-14, in FIG. 2 by MOS transistors 20 and 21, and in FIG. 3 by a combination of thick oxide transistors 30, 31 and one diode 32. A structure of the kind shown in FIG. 1 is known, for instance, from the publication entitled "Electrostatic Discharge Control", by Tarak N. Bhar and Edward J. McMahon, (published by Hayden Book Company, Inc., New Jersey, 1983), pp. 82 and 83.

Previously, the MOS bypass transistors 20 and 21 for CMOS circuits of FIG. 2 were provided as transistors of unlike channel types as is known, for instance, from the publication entitled "Electrical Overstress Protection for Electronic Devices" by Robert Antinone (New Jersey, 1986), part II, section V, part A, and particularly Fig. V.A.7, on page 148 thereof.

As mentioned above, it has been empirically determined that the use of MOS transistors of unlike channel types results in dissimilar response behavior in the transistors and accordingly in poor protection against electrostatic voltages, or ESD protection.

Figure 4:
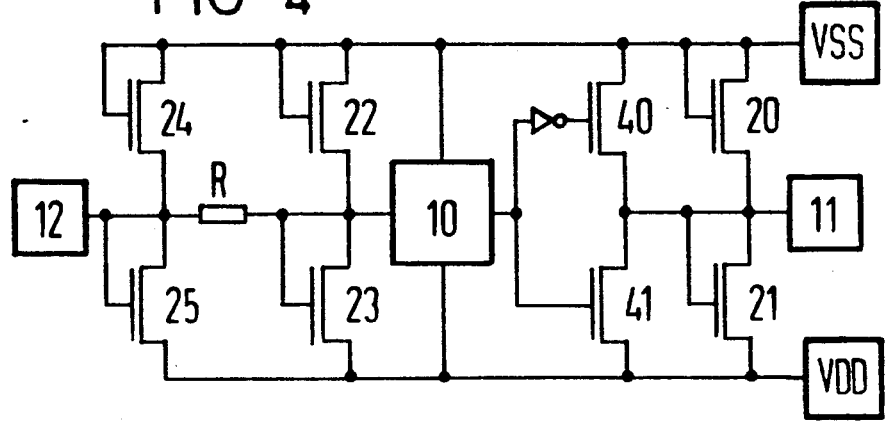
FIG. 4 is a circuit diagram of a particular embodiment of a protective circuit configuration according to the invention.

An integrated circuit 10 is provided in FIG. 4 which is supplied by way of supply potential terminals VDD and VSS. The integrated circuit 10 includes an output 11 and an input 12. Both the output 11 and the input 12 are each assigned a protective circuit according to the invention. Transistors 21 and 20, respectively, are connected between the output 11 and the supply potential terminals VDD and VSS. Similarly, transistors 24 and 25 are connected between the input 12 and the supply potential terminals. A resistor R is connected in series between the input 12 and the integrated circuit 10. At the node between the resistor R and the integrated circuit 10 protective transistors 22 and 23 connect to the respective supply potential terminals. On the output side, the integrated circuit 10 is connected with the output 11 through an output driver with transistors 40 and 41.

The transistors 20 to 25 of the protective circuit are formed as thin-oxide transistors of the n-channel type. The gate and the source of the transistors 20, 22 and 24 are connected to the supply potential VSS. Similarly, the gate and the source of the respective transistors 21, 23 and 25 are directly interconnected. This means that the gate-to-source voltage of the protective transistors is always zero. Accordingly, the MOS-line of the protective transistors is never utilized. The protective function of the protective transistors 20 to 25 is based on its function as a bipolar transistor in the case of heavy-current effects. The gate-length of the transistors, which corresponds to the parasitic base-width of the parasitic bipolar transistor, plays a role in this. The breakdown or starting potential of the transistors depends on the gate-length; the breakdown potential is adjusted such that optimum protection is provided for the terminals of the integrated circuit.

A further feature which is also shown in the circuit configuration of FIG. 4, is that an output driver which is typically present in the integrated circuit 10 and has transistors 40, 41, is shown separately. Through the use of this output driver, the ESD protection can be further improved if the transistors 40, 41 are of the same type. Once again, the transistors 40, 41 are either n-channel MOS transistors or npn bipolar transistors. In order to achieve a p-channel transistor in a conventional output driver, a transistor, such as the transistor 40, may be preceded by an inverter 42.

This last-described further feature can be achieved either alone or together with the transistors 20, 21.

We claim:

1. A circuit configuration for protecting an integrated circuit connected to first and second signal lines and to first and second supply lines, comprising:

two first and two second thin-oxide MOS-transistors of an n-channel type, each with gate, drain and source terminals, wherein said drain terminals of said fist thin-oxide MOS-transistors are connected to the first supply line, and said gate and source terminals of each of said first MOS-transistors are mutually connected to respective ones of the signal lines; and said drain terminals of said second thin-oxide MOS-transistors are connected to respective ones of the signal lines and said gate and source terminals are mutually connected to the second supply line.

2. The circuit configuration according to claim 1, including an output driver connected between the integrated circuit and the second signal line, said output driver including first and second MOS transistors of the same channel type each with a gate, a drain and a source terminal, and an inverter, said drain terminal of said first MOS transistor being connected to the first supply line, said source terminal of said first MOS transistor being connected to said drain terminal of said second MOS transistor and the second signal line, said source terminal of said second MOS transistor being connected to the second supply line, and one of said gate terminals of said MOS transistors being directly connected to the integrated circuit and the other of said gate terminals of said MOS transistors being connected to the integrated circuit via said inverter.

3. A circuit configuration for protecting terminals of CMOS integrated circuits connected to first and second supply potential terminals and to first and second signal lines, comprising:

two first and two second thin-oxide MOS-transistors of an n-channel type, each with gate, drain and source terminals, wherein said drain terminals of said first thin-oxide MOS-transistors are connected to the first supply potential terminal, and said gate and source terminals of each of said first MOS-transistors are mutually connected to respective ones of the signal lines; and said drain terminals of said second thin-oxide MOS-transistors are connected to respective ones of the signal lines and said gate and source terminals are mutually connected to the second supply potential terminal.

4. The circuit configuration according to claim 3, including an output driver connected between the integrated circuit and one of the signal lines, said output driver including first and second MOS transistors of the same channel type each with a gate, a drain and a source terminal, and an inverter, said drain terminal of said first MOS transistor being connected to the first supply line, said source terminal of said first MOS transistor being connected to said drain terminal of said second MOS transistor and to the second signal line, said source terminal of said second MOS transistor being connected to the second supply line, and one of said gate terminals of said MOS transistors being directly connected to the integrated circuit and the other of said gate terminals of said MOS transistors being connected to the integrated circuit via said inverter.

* * * * *